May 30, 1967 R. L. NOACK ETAL 3,322,871

METHOD OF FORMING A PATTERN

Filed Aug. 29, 1963

4 Sheets-Sheet 1

INVENTORS
ROBERT L. NOACK &
CHANDLER WENTWORTH

BY Samuel Cole

Attorney

INVENTORS
ROBERT L. NOACK &
CHANDLER WENTWORTH
BY Samuel Cohen
Attorney

INVENTORS
ROBERT L. NOACK &
CHANDLER WENTWORTH
BY Samuel Cohen
Attorney

INVENTORS
ROBERT L. NOACK &
CHANDLER WENTWORTH
BY Samuel Cohen
Attorney

United States Patent Office 3,322,871
Patented May 30, 1967

3,322,871
METHOD OF FORMING A PATTERN

Robert L. Noack, Neshanic, and Chandler Wentworth, Princeton, N.J., assignors to Radio Corporation of America, a corporation of Delaware
Filed Aug. 29, 1963, Ser. No. 305,250
3 Claims. (Cl. 264—104)

This invention relates to the problem of depositing material such as a metal paste or slurry through a mask. The problem is encountered in the making of ceramic bodies with embedded conductors, such as so-called "doctor bladed" ferrite memories.

An object of the invention is to provide an improved method of making screeded elements—elements made by forcing a slurry through a mask onto a substrate.

Another object of the invention is to provide a method of making screeded conductors through masks of intricate design and/or with very closely spaced openings.

Another object of the invention is to provide an improved masking method in which the tendency of the slurry to pass under the mask and thereby cause smearing of the pattern laid down is substantially lessened.

Still another object of the invention is to provide an improved masking method for making conductors with relatively square, relatively straight edges.

The various objects above are accomplished according to the present invention by employing silicone rubber as a substrate for the mask. It is found that the mask sticks to the substrate even under the pressure of the slurry being forced through the mask onto the substrate. It is also found that the slurry does not pass under the mask even when the slurry has relatively low viscosity. When employed for making conductors, such a described shortly, it is found that the binder employed does not wet the silicone substrate and it is believed that it is for this reason that the pattern produced has relatively square and relatively straight edges.

The invention is discussed in greater detail below and is shown in the following drawings of which:

Figure 1:
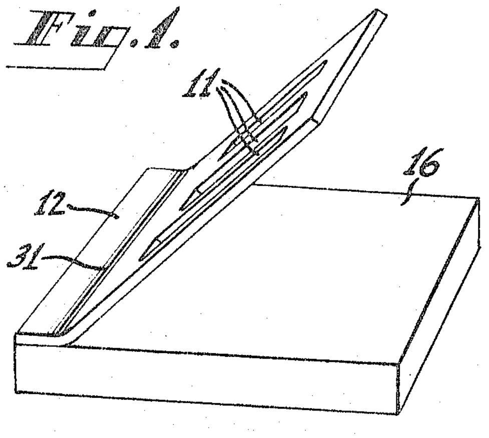
FIGS. 1–6 illustrate successive steps in one method of making a so-called "doctor bladed" ferrite memory.
Figure 4:
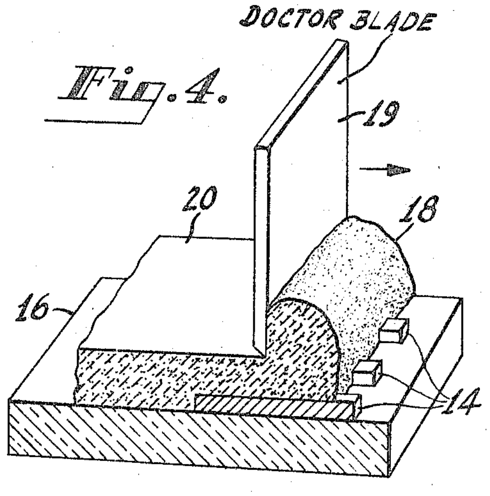

A prior art method of making a memory employing masks is shown in FIGS. 1–6. Referring to FIG. 1, a mask 10 is formed with openings 11 therein of a desired conductor pattern. The mask is made of a spring metal such as beryllium copper and is bent at an angle along line 31. The mask is held at one edge 12 to a glass substrate 16. The major part of the mask therefore extends at an angle from the substrate.

Figure 2:
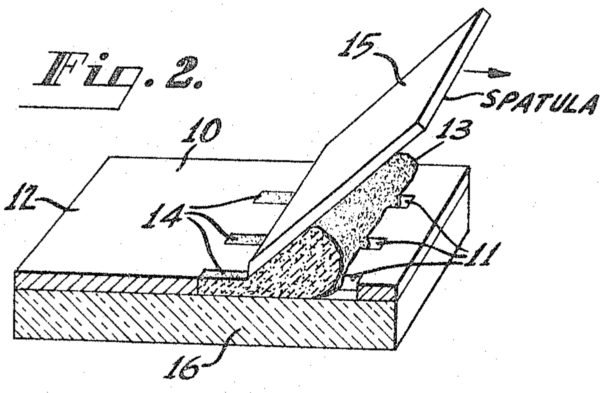

A mixture consisting of a refractory metal powder and a small percentage by weight of automotive grease is forced through the openings in the mask to produce the conductor pattern. This may be done as shown in FIG. 2 by employing the straight edge of a spatula 15. The spatula holds the mask against the substrate. At the same time, as the spatula moves, it forces a refractory metal-grease paste 13 into the openings in the mask. The mask acts as a screed to control the thickness of the applied paste.

After the spatula has passed over the mask and been removed, the mask springs back to its original position.

Figure 3:
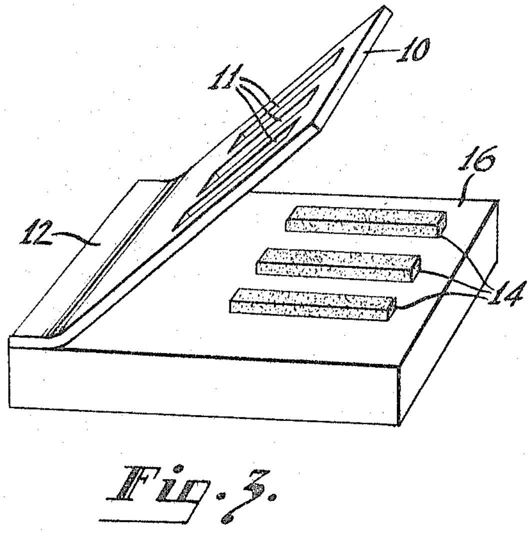

The conductor pattern shown at 14 in FIG. 3 adheres to the substrate 16.

Thereafter, the mask is removed and a ferrite slurry is "doctor bladed" over the conductor pattern. The slurry is shown at 18 in FIG. 4, and the doctor blade is shown at 19. In laying down the ferrite, the doctor blade is maintained at a uniform height over the surface of the substrate to provide a ferrite layer of uniform thickness, as indicated at 20. Means other than a doctor blade, as for example, spraying, may be employed to provide the layer 20.

Figure 5:
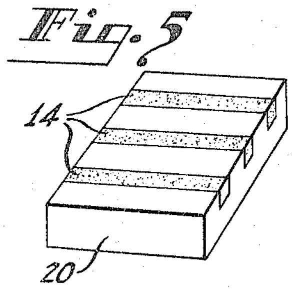

The ferrite slurry is then permitted to dry. Only a relatively short time is required. When the slurry is dry, the layer 20 becomes flexible and leather-like and it may be peeled from the substrate and trimmed at its edges. The article which results is shown in FIG. 5. The conductors 14 are embedded in the "green" (that is, uncured) ferrite and peel away from the substrate with the ferrite.

Figure 6:
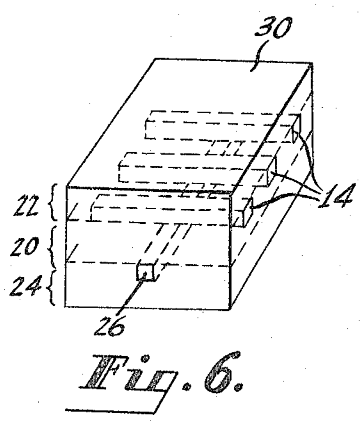

After the sheet of FIG. 5 is obtained, a second green ferrite sheet 22 may be placed over the sheet 20 and a third green ferrite sheet 24 with conductors such as 26 may be placed on the opposite side of the ferrite sheet 20, as shown in FIG. 6. Thereafter, the sheets may be laminated under pressure for a relatively short time and at a relatively low temperature in order to cause the three sheets to bond together. Thereafter, the entire structure of FIG. 6 is fired to burn out the various binders and to cause the ferrite to assume the desired magnetic properties.

Figure 7:
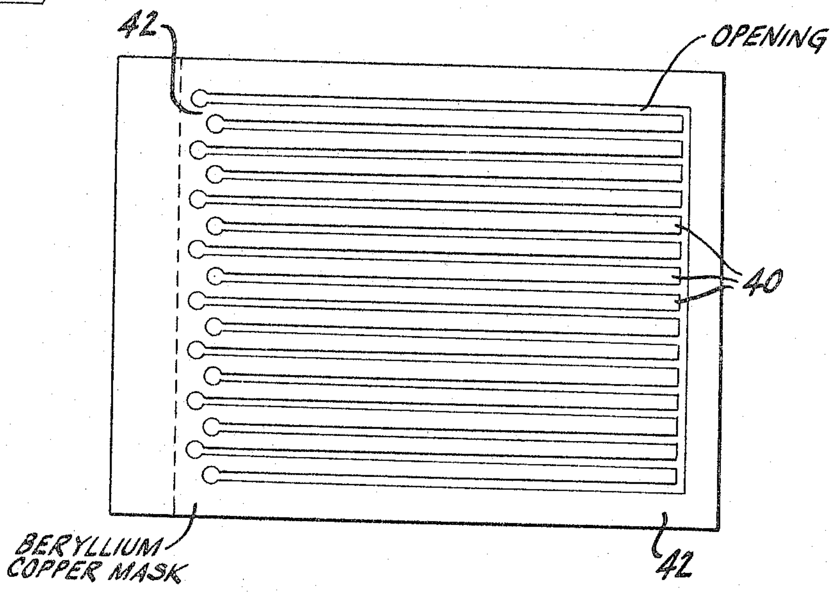
FIG. 7 is a plan view of a somewhat more intricate mask than the one shown in FIGS. 1–6.
Figure 8:
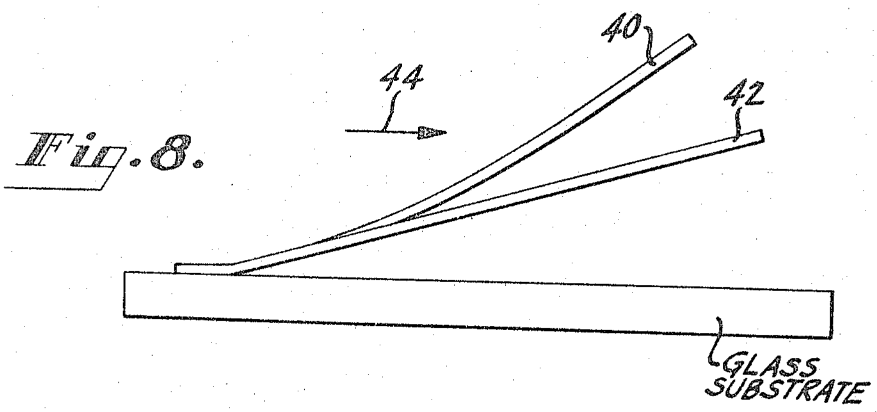
FIG. 8 is a side view of the mask of FIG. 7.

The method above is also suitable for laying down conductors in a somewhat more intricate pattern than shown in FIGS. 1–6. A mask such as shown in FIG. 7 may be employed. Here, the metal strips such as 40 between the openings in the mask are supported only at one end 42. When the mask is held down on the substrate as shown in FIG. 8, the free ends of the metal strips 40 stand away from the remainder of the mask 42. The technique illustrated in FIGS. 1–6 may be employed to force a slurry through the mask by passing a slurry covered spatula over the mask in the direction of arrow 44. However, if the openings are very closely spaced, or if the screeding is not performed very carefully, the metal strips 40 become distorted and damaged during the screeding step.

Figure 9:
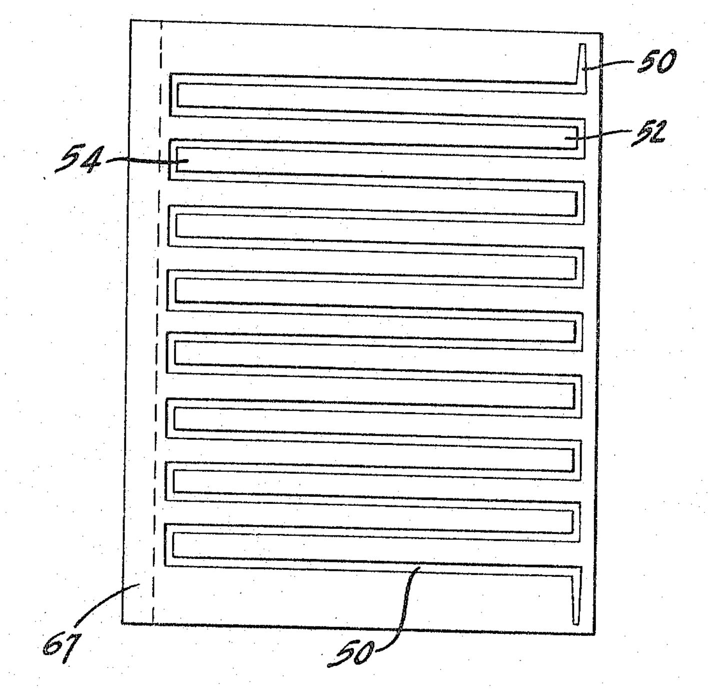
FIGS. 9 and 10 are plan and side views of another type of mask, this one with a more intricate pattern than the one of FIG. 7.
Figure 10:
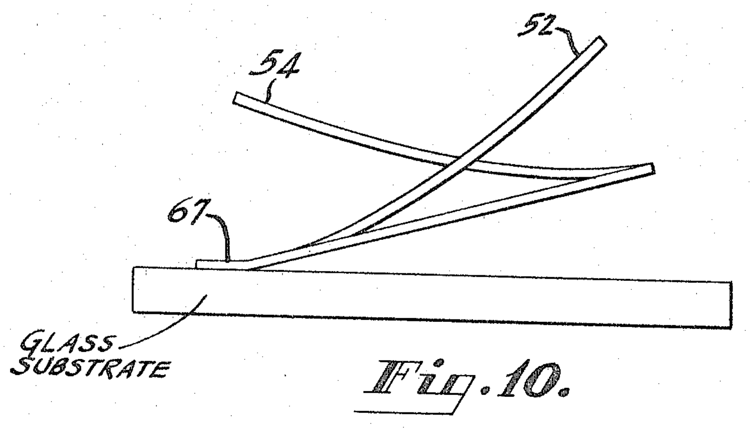

An even more intricate mask is shown in FIGS. 9 and 10. The opening 50 defines a single conductor. However, due to the resiliency of the metal the non-supported strips 52 and 54 stand away from the remainder of the mask as is shown in FIG. 10. It is found that when one attempts to force a slurry through the opening 50 in the mask, the mask becomes damaged very easily. Regardless of the direction in which the spatula is moved, it bears against the free ends of some of the metal strips and in a short time permanently distorts the mask.

Figure 11:
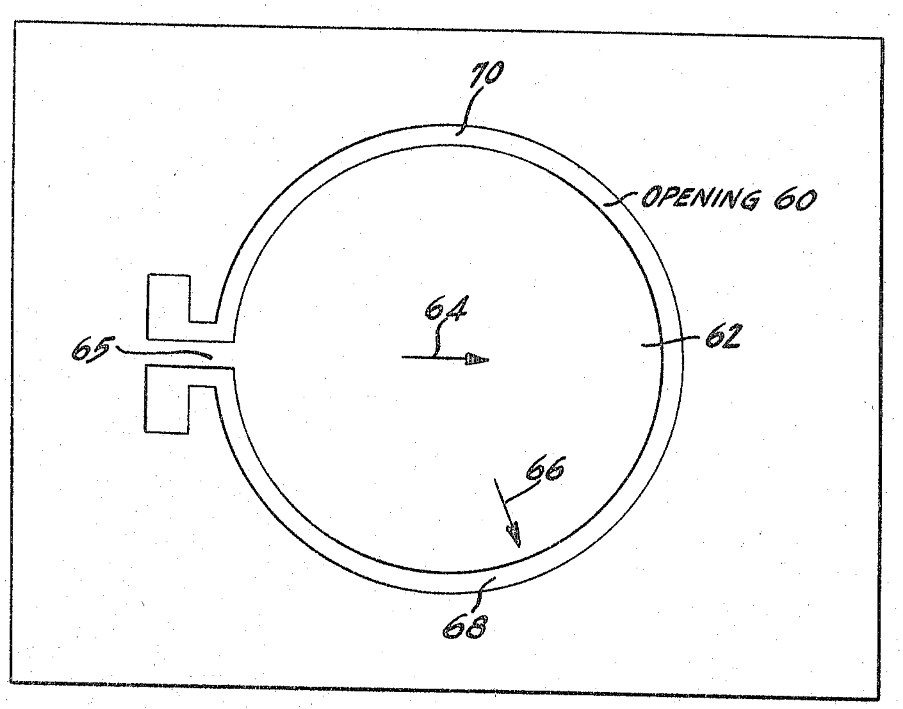
FIGS. 11 and 12 are plan and side views, respectively, of still another type of mask.
Figure 12:
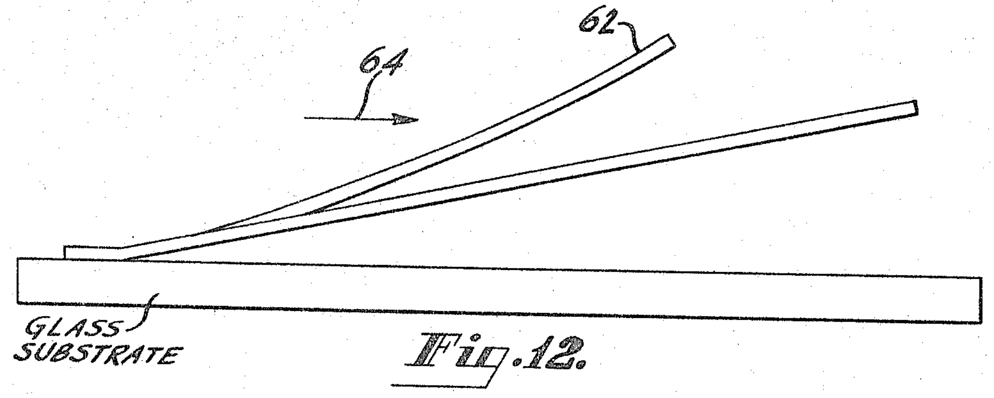

It is also found difficult to use the method of FIGS. 1–6 with a mask such as shown in FIGS. 11 and 12. The opening 60 is circularly shaped and the metal piece 62 within the opening is held to the remainder of the mask only by the narrow shoulder 65. It is found when attempting to force the slurry into the opening 60 by moving a slurry covered spatula over the mask in the direction of arrow 64, that the relatively large piece 62 does not remain centered. For example, the metal piece 62 may be moved in the direction of arrows 66 during the movement of the spatula and this causes the opening in the region 68 to be quite narrow or to close and the opening in the region 70 to become correspondingly larger. In addition, the shoulder 65 becomes damaged easily and often breaks off after a number of passes with the spatula, ruining the mask.

Figure 13:
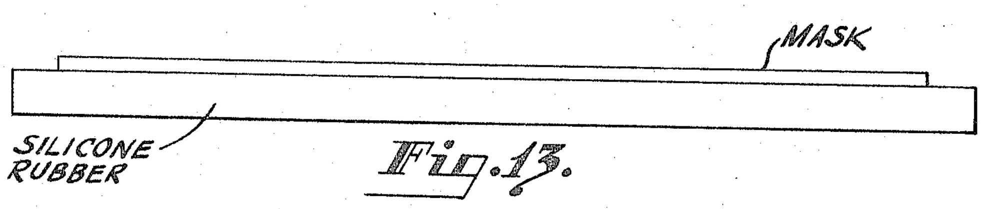
FIG. 13 is a side view to illustrate the masking method of the present invention.

The masking method of the present invention is illustrated in FIG. 13. Rather than employing glass as a substrate, a silicone rubber is employed. The silicone rubber is commercially available as a paste such as RTV–11, RTV–60, LTV–602 and so on. The silicone rubber may be laid down by doctor blading the paste mixed with a catalyst onto a substrate, or into a form. After standing for 24 hours or so, the rubber hardens and cures, and is suitable for use.

It is found that a mask made of a resilient material such as beryllium copper, Phosphor bronze or the like, when laid down on the silicone rubber substrate, sticks to the substrate throughout the extent of the mask. This is unexpected and the reason why it occurs is not fully understood. A mask such as shown in FIGS. 9 and 10, preferably without the bend 67, once gently pressed down on the silicone rubber, adheres thereto. It is then possible to employ a spatula to force the conductive slurry into the openings such as 50 in the mask of FIG. 9 in the same manner as illustrated in FIG. 2 above. The free ends of metal strips 52 and 54 do not become damaged in the process, even if the direction of the movement of the spatula is changed. As a matter of fact, the spatula can even move at right angles to the direction in which the strips 52, 54 of the mask extend. This is found to be advantageous when the pattern is intricate as it insures that the corners of all openings become filled. It is also found that because the mask adheres to the silicone rubber, the conductive paste does not pass beneath the mask even when the slurry is of relatively low viscosity. Therefore, the patterns laid down are very accurate reproductions of the mask pattern, even in cases in which there are very narrow openings which are spaced very close to one another. Successful patterns have been laid down using the method of the invention with masks having metal strips analogous to 52 and 54 of FIGS. 9 and 10 approximately .002" in width spaced on .004" centers.

After the conductors are laid down, the mask is removed. This is easily done by grasping the mask at one corner and peeling it away from the substrate. Then, the ferrite is doctor bladed over the conductors and the doctor bladed ferrite allowed to dry. It is found, in practice, that the dried sheet of green doctor bladed ferrite with the embedded conductors is quite easy to remove from the silicone rubber substrate—more so than when using glass, in a number of instances. It is believed that neither the doctor bladed material nor the screeded conductors easily wet the silicone substrate. On the other hand, when using a glass substrate, some ferrite compositions are found to stick to the glass and to require lubrication with water before they can be removed.

It is also found in practicing the invention that conductors laid down through the mask have square edges and are quite straight. When using a glass substrate on which conductors are formed from a slurry of low viscosity, there is sometimes a tendency for the slurry to slump at the edges of the conductor and to thereby become uneven. When employing a silicone rubber substrate this has been found not to occur and it is believed that it does not occur because the grease binder does not wet the silicone rubber substrate.

Another advantage of the method of the invention is that it is suitable for the mass production of screeded elements. Here the silicone rubber substrate is made as a continuous belt along which many masks are processed, in sequence, as they successively pass under stations which perform the steps corresponding to those illustrated in FIGS. 2–5.

The masks employed in the method of the invention are generally made by etching with acid. The thickness of the mask depends upon the thickness desired for the pattern laid down. For example, the masks may be 1 to 1.5 mils or more.

What is claimed is:

1. A method of forming a pattern on a substrate comprising the steps of:
- laying a resilient metal mask on a silicone rubber substrate whereby said mask adheres to said substrate;
- forcing a slurry through the mask onto the substrate; and
- peeling away the mask to leave on the substrate a pattern formed of said slurry.

2. A method of forming a conductive pattern on a substrate comprising the steps of:
- laying a resilient metal mask on a silicone rubber substrate whereby said mask adheres to said substrate;
- forcing a slurry formed of a metal powder in a grease binder through the mask onto the substrate; and
- peeling away the mask to leave on the substrate a pattern formed of said slurry.

3. A method of making a doctor bladed ferrite memory comprising the steps of:
- placing a beryllium copper mask having openings in a desired pattern onto a silicone rubber substrate thereby causing the mask to adhere to the substrate;
- placing a conductive slurry over the mask;
- passing a spatula over the mask to force the conductive slurry into the openings in the mask;
- peeling the mask away from the substrate; and
- doctor blading a ferrite slurry over the conductor pattern remaining on the substrate.

References Cited

UNITED STATES PATENTS

| | | | |
|---|---|---|---|
| 3,002,847 | 10/1961 | Shaffer et al. | 117—5.5 |
| 3,002,848 | 10/1961 | Clark | 117—5.5 XR |
| 3,210,214 | 10/1965 | Smith | 117—5.5 XR |
| 3,226,255 | 12/1965 | Cieniewicz et al. | 117—5.5 XR |
| 3,240,624 | 3/1966 | Beck | 117—5.5 XR |

ROBERT F. WHITE, *Primary Examiner.*

J. A. FINLAYSON, *Assistant Examiner.*